US012787444B2

(12) United States Patent
Hou et al.

(10) Patent No.: US 12,787,444 B2
(45) Date of Patent: Nov. 3, 2026

(54) ARRAY SUBSTRATE AND DISPLAY APPARATUS

(71) Applicants: Beijing BOE Display Technology Co., Ltd., Beijing (CN); BOE Technology Group Co., Ltd., Beijing (CN)

(72) Inventors: Wenjie Hou, Beijing (CN); Yingmeng Miao, Beijing (CN); Dongchuan Chen, Beijing (CN); Tao Yang, Beijing (CN); Yue Yang, Beijing (CN)

(73) Assignees: Beijing BOE Display Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 359 days.

(21) Appl. No.: 18/644,017

(22) Filed: Apr. 23, 2024

(65) Prior Publication Data

US 2024/0347545 A1 Oct. 17, 2024

Related U.S. Application Data

(63) Continuation of application No. PCT/CN2023/088751, filed on Apr. 17, 2023.

(51) Int. Cl.
*H10D 86/60* (2025.01)
*H10D 86/40* (2025.01)

(52) U.S. Cl.
CPC ........... *H10D 86/60* (2025.01); *H10D 86/441* (2025.01)

(58) Field of Classification Search
CPC ............................ H10D 86/60; H10D 86/441
See application file for complete search history.

(56) References Cited

U.S. PATENT DOCUMENTS

| | | | | |
|---|---|---|---|---|
| 10,254,864 | B2 * | 4/2019 | Kim | G06F 3/04164 |
| 2008/0079005 | A1 | 4/2008 | Tseng | |
| 2014/0034949 | A1 | 2/2014 | Matsukura | |

(Continued)

FOREIGN PATENT DOCUMENTS

| | | | |
|---|---|---|---|
| CN | 101425542 | A | 5/2009 |
| CN | 103299431 | B | 6/2016 |
| CN | 107134463 | A | 9/2017 |

(Continued)

*Primary Examiner* — Errol V Fernandes
(74) *Attorney, Agent, or Firm* — IPro, PLLC

(57) ABSTRACT

Disclosed are an array substrate and a display apparatus. The array substrate includes a substrate; a gate line layer; an insulating layer; a first electrode, arranged on a side of the insulating layer facing away from the gate line layer, and including a first electrode sub-portion and a second electrode sub-portion connected with the first electrode sub-portion, an orthographic projection of the first electrode sub-portion on the substrate partially overlaps with an orthographic projection of the gate line on the substrate, and the first electrode sub-portion is electrically connected with the gate line through the first via hole; and an active layer, an orthographic projection of the second electrode sub-portion on the substrate overlaps with an orthographic projection of the active layer on the substrate, and the orthographic projection of the active layer on the substrate does not overlap with the orthographic projection of the gate line on the substrate.

20 Claims, 9 Drawing Sheets

(56) References Cited

U.S. PATENT DOCUMENTS

| | | | |
|---|---|---|---|
| 2021/0240043 | A1 | 8/2021 | Wang et al. |
| 2021/0335841 | A1 | 10/2021 | Lee et al. |

FOREIGN PATENT DOCUMENTS

| | | | | | |
|---|---|---|---|---|---|
| CN | 207367974 | U | | 5/2018 | |
| CN | 109659314 | A | | 4/2019 | |
| CN | 111640764 | A | | 9/2020 | |
| CN | 115236907 | A | | 10/2022 | |
| CN | 120224748 | A | * | 6/2025 | ......... H10K 59/1213 |

* cited by examiner

ARRAY SUBSTRATE AND DISPLAY APPARATUS

CROSS-REFERENCE TO RELATED APPLICATIONS

The application is a continuation application of International Application No. PCT/CN2023/088751, filed Apr. 17, 2023, which is hereby incorporated by reference in its entirety.

TECHNICAL FIELD

The present disclosure relates to the technical field of semiconductors, in particular to an array substrate and a display apparatus.

BACKGROUND

Display products with 8K Ultra HD resolution (7680×4320) are currently receiving more and more attention in the market, which have high resolution and fine picture quality, and can provide a better viewing experience for those who are in pursuit of the ultimate picture quality. However, since 8K products have too many sub-pixels on screens, the pixel size is smaller, the liquid crystal capacitance (Cst) value is also smaller, the storage voltage is greatly affected by pulling of coupling capacitance (Cgs) of a gate line and a transistor source (TFT Source), sticking image, shake head pattern and other undesirable phenomena are easily caused, and therefore, reducing Cgs is very meaningful to improve the picture quality of 8K products.

SUMMARY

Embodiments of the present disclosure provide an array substrate, including:

- a substrate;
- a gate line layer, arranged on a side of the substrate, and where the gate line layer includes a gate line extending in a first direction;
- an insulating layer, arranged on a side of the gate line layer facing away from the substrate, where the insulating layer has a first via hole exposing a portion of the gate line;
- a first electrode, arranged on a side of the insulating layer facing away from the gate line layer, where the first electrode includes a first electrode sub-portion and a second electrode sub-portion connected with the first electrode sub-portion, an orthographic projection of the first electrode sub-portion on the substrate partially overlaps with an orthographic projection of the gate line on the substrate, and the first electrode sub-portion is electrically connected with the gate line through the first via hole; and
- an active layer, where an orthographic projection of the second electrode sub-portion on the substrate overlaps with an orthographic projection of the active layer on the substrate, and the orthographic projection of the active layer on the substrate does not overlap with the orthographic projection of the gate line on the substrate.

In some embodiments, the array substrate includes a pixel electrode layer, the pixel electrode layer includes a plurality of pixel electrodes, and the first electrode is arranged on the pixel electrode layer and is insulated from the pixel electrodes.

In some embodiments, the array substrate further includes a data line layer, and the data line layer is arranged between the gate line layer and the first electrode;

- the data line layer includes: a plurality of data lines extending in a second direction, a first electrode of a transistor connected with one side of one data line, and a second electrode of a transistor provided opposite to the first electrode of the transistor;
- the first electrode of the transistor includes: a first sub-portion, a second sub-portion, and a third sub-portion, where one end of the first sub-portion is electrically connected with the data lines, the other end of the first sub-portion is electrically connected with one end of the second sub-portion, the other end of the second sub-portion is electrically connected with the third sub-portion, an orthographic projection of the second sub-portion on the substrate overlaps with the orthographic projection of the active layer on the substrate, and an orthographic projection of the third sub-portion on the substrate does not overlap with the orthographic projection of the active layer on the substrate; and
- the second electrode of the transistor includes: a fourth sub-portion, a fifth sub-portion, and a sixth sub-portion, where an orthographic projection of the fourth sub-portion on the substrate overlaps with an orthographic projection of the pixel electrode on the substrate, an orthographic projection of the fifth sub-portion on the substrate overlaps with the orthographic projection of the active layer on the substrate, and an orthographic projection of the sixth sub-portion on the substrate does not overlap with the orthographic projection of the active layer on the substrate.

In some embodiments, the first sub-portion, the second sub-portion and the third sub-portion all extend in the first direction.

In some embodiments, both the fifth sub-portion and the sixth sub-portion extend in the first direction, and the fourth sub-portion extends in the second direction.

In some embodiments, the active layer is arranged between the data line layer and the gate line layer.

In some embodiments, the active layer is arranged between the data line layer and the first electrode.

In some embodiments, the first via hole partially exposes the gate line, and partially exposes the substrate, and an orthographic projection of the first electrode on the substrate covers an orthographic projection of the first via hole on the substrate.

In some embodiments, the insulating layer includes: a gate electrode insulating layer and/or a passivation layer.

In some embodiments, a thickness of the gate electrode insulating layer ranges from 0.35 μm to 0.45 μm.

In some embodiments, the gate line layer further includes: a gate electrode, and an orthographic projection of the gate electrode on the substrate covers the orthographic projection of the active layer on the substrate.

In some embodiments, the gate electrode and the gate line are mutually insulated and have a gap between the gate electrode and the gate line.

In some embodiments, the gate line includes a first gate line portion and a second gate line portion arrayed in the first direction, where an orthographic projection of the first gate line portion on the substrate is arranged between orthographic projections of the adjacent data lines on the substrate, and an orthographic projection of the second gate line portion on the substrate overlaps with an orthographic projection of a data line on the substrate; and the first gate line portion has a missing portion, and the gate electrode is arranged in a region where the missing portion is located.

In some embodiments, the first electrode further includes a third electrode sub-portion arranged between the first electrode sub-portion and the second electrode sub-portion, an orthographic projection of the third electrode sub-portion on the substrate covers an orthographic projection of the gap on the substrate, and the first electrode sub-portion and the second electrode sub-portion are electrically connected through the third electrode sub-portion.

Embodiments of the present disclosure provide a display apparatus, including the array substrate provided by the embodiment of the present disclosure.

DETAILED DESCRIPTION

Figure 1A:
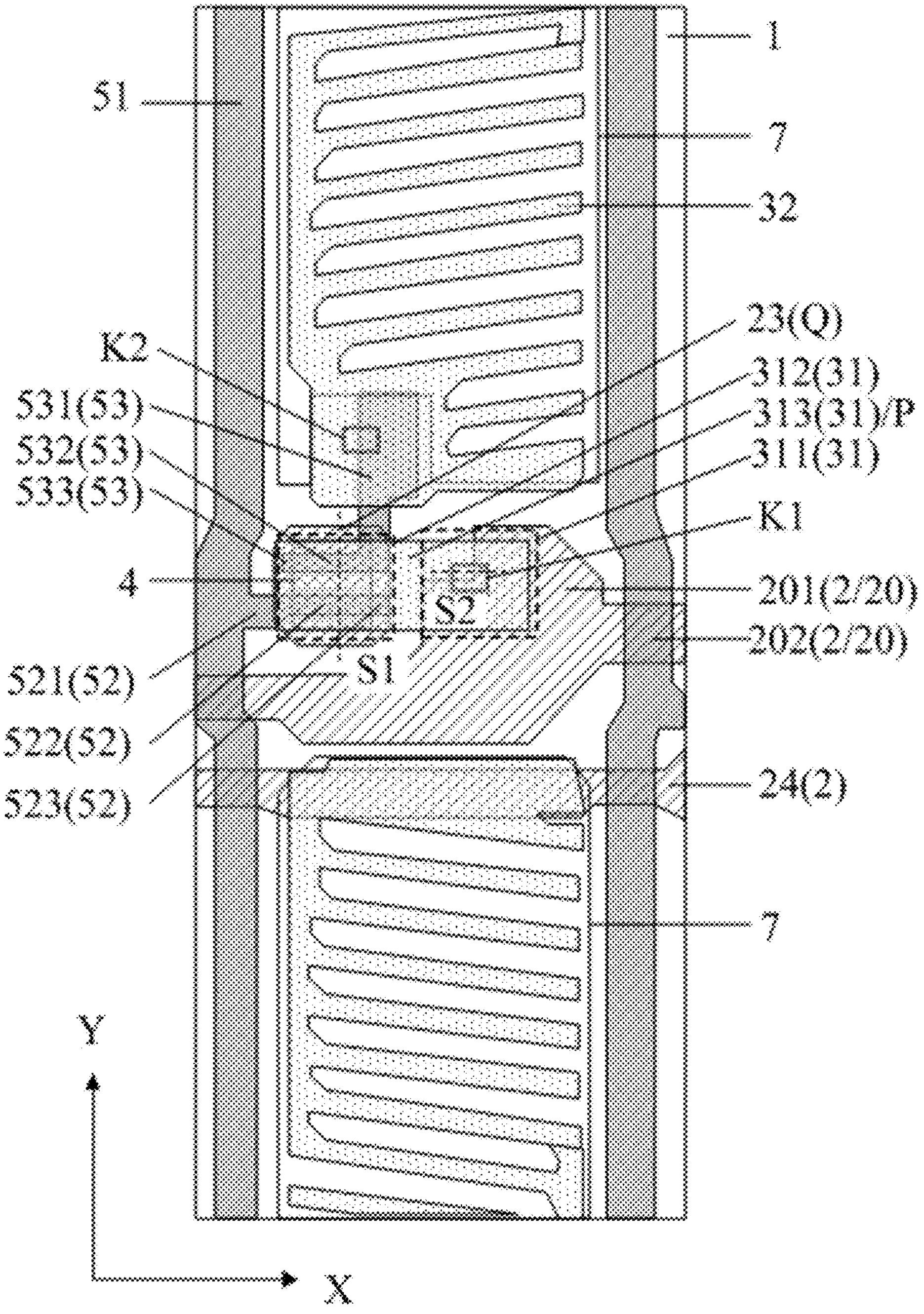
FIG. 1A is a first schematic top-view diagram of an array substrate provided by an embodiment of the present disclosure.

In order to make the objectives, technical solutions and advantages of embodiments of the present disclosure clearer, the technical solutions of the embodiments of the present disclosure will be clearly and completely described below in conjunction with the accompanying drawings of the embodiments of the present disclosure. It needs to be noted that the sizes and shapes of all figures in the accompanying drawings do not reflect true scales, and are only intended to schematically illustrate the content of the present disclosure. The same or similar reference numerals represent the same or similar elements or elements with the same or similar functions throughout. Apparently, the described embodiments are only a part of the embodiments of the present disclosure, not all of the embodiments. Based on the described embodiments of the present disclosure, all the other embodiments obtained by those of ordinary skill in the art without creative work shall fall within the protection scope of the present disclosure.

Unless otherwise defined, technical or scientific terms used herein shall have the ordinary meanings understood by those ordinarily skilled in the art to which the present disclosure pertains. The words "first", "second" and the like used in the specification and claims of the present disclosure do not indicate any order, quantity or importance, but are only configured to distinguish different components. The words "comprise" or "include" and the like indicate that an element or item appearing before the words covers listed elements or items appearing after the words and equivalents thereof, and does not exclude other elements or items. "Inner", "outer", "upper" and "lower" and the like are only used to represent relative position relationships, and the relative position relationships may also change accordingly after an absolute position of a described object is changed.

As used herein, "about" or "substantially the same" includes the stated value and means within an acceptable range of deviation from the specific value, as determined by those of ordinary skill in the art, taking into account the measurements discussed and the errors associated with the measurement of the specific quantity (i.e., the limitations of a measurement system). For example, "substantially the same" may mean that the difference relative to the stated value is within one or more standard deviations, or within +30%, 20%, 10%, and 5%.

In the accompanying drawings, the thicknesses of layers, films, panels, regions, etc. are enlarged for clarity. Exemplary implementations are described herein with reference to cross-sectional diagrams of schematic diagrams that serve as idealized implementations. In this way, deviations from the shape of the figure as a result of, for example, manufacturing techniques and/or tolerances will be expected. Thus, implementations described herein should not be construed as being limited to the specific shape of a region as shown herein, but rather include deviations in shape caused by, for example, manufacturing. For example, regions illustrated or described as flat may typically have rough and/or non-linear characteristics. In addition, the sharp corners illustrated may be rounded. Thus, the regions shown in the figures are schematic in nature, and their shapes are not intended to be the precise shapes of the illustrated regions and are not intended to limit the scope of the present claims.

In order to keep the following descriptions of the embodiments of the present disclosure clear and concise, detailed descriptions of known functions and known components are omitted in the present disclosure.

For the above problems in the related art, embodiments of the present disclosure provide an array substrate and a display apparatus.

The implementations of the array substrate and a display apparatus provided by embodiments of the present disclosure are illustrated in detail below in conjunction with the accompanying drawings. The thicknesses and shapes of all film layers in the accompanying drawings do not reflect true scales, and are only intended to schematically illustrate the content of the present disclosure.

Embodiments of the present disclosure provide an array substrate. Referring to FIG. 1A to FIG. 1H, FIG. 1B is a schematic cross-sectional diagram along a dotted line S1 in FIG. 1A; FIG. 1C is another schematic cross-sectional diagram along the dotted line S1 in FIG. 1A; FIG. 1D is a schematic cross-sectional diagram along a dotted line S2 in FIG. 1A; FIG. 1E is a schematic diagram of a single film layer of a gate line layer in FIG. 1A; FIG. 1F is a schematic diagram of a single film layer of an active layer in FIG. 1A; FIG. 1G is a schematic diagram of a single film layer of a data line layer in FIG. 1A; and FIG. 1H is a schematic diagram of a single film layer of a pixel electrode layer in FIG. 1A. The array substrate includes:

a substrate 1;

a gate line layer 2, arranged on a side of the substrate 1, the gate line layer includes a gate line 20 extending in a first direction X;

an insulating layer 6, arranged on a side of the gate line layer 2 facing away from the substrate 1, and having a first via hole K1 exposing a portion of the gate line 20;

a first electrode 31, arranged on a side of the insulating layer 6 facing away from the gate line layer 2, and including a first electrode sub-portion 311 and a second electrode sub-portion 312 connected with the first electrode sub-portion 311, wherein an orthographic projection of the first electrode sub-portion 311 on the substrate 1 partially overlaps with an orthographic projection of the gate line 20 on the substrate 1, and the first electrode sub-portion 311 is electrically connected with the gate line 20 through the first via hole K1; and an active layer 4, where an orthographic projection of the second electrode sub-portion 312 on the substrate 1 overlaps with an orthographic projection of the active layer 4 on the substrate 1, and the orthographic projection of the active layer 4 on the substrate 1 does not overlap with the orthographic projection of the gate line 20 on the substrate 1.

In embodiments of the present disclosure, the first electrode 31 is provided on one side of the insulating layer 6 facing away from the gate line layer 2, and includes the first electrode sub-portion 311 and the second electrode sub-portion 312; and the first electrode sub-portion 311 is electrically connected with the gate line 20 through the first via hole K1, the first electrode 31 may serve as a top gate, the insulating layer exists between the first electrode 31 and the gate line 20, and the insulating layer 6 may have a large thickness, which may substantially reduce the value of coupling capacitance Cgs, thereby facilitating the improvement of the picture quality, and thus solving the problems such as sticking image or shake head pattern caused when storage voltages of positive and negative frames of pixels are pulled by the coupling capacitance during charging and a difference value of $\Delta Vp$ or a value of $\Delta Vp$ is too large.

In some embodiments, referring to FIG. 1A to FIG. 1H, the array substrate includes a pixel electrode layer, the pixel electrode layer includes a plurality of pixel electrodes 32, and the first electrode 31 is arranged on the pixel electrode layer and is insulated from the pixel electrodes 32. In embodiments of the present disclosure, the first electrode 31 is arranged on the pixel electrode layer, which allows the bottom gate design to be modified to the top gate design without increasing the number of array substrate masks (Mask layer), thereby realizing a significant reduction in the value of the coupling capacitance Cgs, improving the picture quality, and solving the problems such as sticking image or shake head pattern.

In some embodiments, referring to FIG. 1A to FIG. 1H, the array substrate further includes a data line layer, arranged between the gate line layer 2 and the first electrode 31; the data line layer includes: a plurality of data lines 51 extending in a second direction Y, a first electrode 52 of a transistor connected with one side of the data line 51, and a second electrode 53 of a transistor provided opposite to the first electrode 52 of the transistor;

the first electrode 52 of the transistor includes: a first sub-portion 521, a second sub-portion 522, and a third sub-portion 523, where one end of the first sub-portion 521 is electrically connected with the data line 51, the other end of the first sub-portion 521 is electrically connected with one end of the second sub-portion 522, the other end of the second sub-portion 522 is electrically connected with the third sub-portion 523, an orthographic projection of the second sub-portion 522 on the substrate 1 overlaps with the orthographic projection of the active layer 4 on the substrate 1, and an orthographic projection of the third sub-portion 523 on the substrate 1 does not overlap with the orthographic projection of the active layer 4 on the substrate 1; and the second electrode 53 of the transistor includes: a fourth sub-portion 531, a fifth sub-portion 532, and a sixth sub-portion 533, where an orthographic projection of the fourth sub-portion 531 on the substrate 1 overlaps with orthographic projections of the pixel electrodes 32 on the substrate 1, an orthographic projection of the fifth sub-portion 532 on the substrate 1 overlaps with the orthographic projection of the active layer 4 on the substrate 1, and an orthographic projection of the sixth sub-portion 533 on the substrate 1 does not overlap with the orthographic projection of the active layer 4 on the substrate 1. In some embodiments, the pixel electrodes 32 are conductive to the fourth sub-portion 531 through a second via hole K2.

In conventional design, in order to ensure that when an active layer and a data line layer occur interlayer offset, a source-drain electrodes and the active layer can still completely overlap, the area of the active layer is increased, an active layer tail (Active Tail) exists on the outer side of the source-drain electrodes, so that the active layer completely wraps the source-drain electrodes, but this will make the capacitance between the active layer and a gate line larger. However, in the embodiment of the present disclosure, the first electrode 52 of the transistor includes: the first sub-portion 521, the second sub-portion 522, and the third sub-portion 523, the orthographic projection of the third sub-portion 523 on the substrate 1 does not overlap the orthographic projection of the active layer 4 on the substrate 1, the second electrode 53 of the transistor includes: the fourth sub-portion 531, the fifth sub-portion 532, and the sixth sub-portion 533, and the orthographic projection of the sixth sub-portion 533 on the substrate 1 does not overlap the orthographic projection of the active layer 4 on the substrate 1. That is, in the embodiment of the present disclosure, the first electrode 52 of the transistor and the second electrode 53 of the transistor are patterns protruding from the active layer 4 (specifically, by reducing the area of the active layer 4), an overlapping area of the active layer 4 and the gate line 20 can be reduced, on the one hand, the load of the gate line 20 can be reduced and the charging rate is improved, and on the other hand, the value of the coupling capacitance Cgs can be effectively reduced, which is conducive to the improvement of the picture quality.

In some embodiments, referring to FIG. 1A to FIG. 1H, the first sub-portion 521, the second sub-portion 522 and the third sub-portion 523 all extend in the first direction X. Compared to the structural design in which the first electrode 52 of the transistor is parallel to the data lines 51, as shown in FIG. 2, the gate line 20 has a limited setup space at that position, the line width is narrower, and the resistance is larger, which is not conducive to signal transmission. In embodiments of the present disclosure, the first electrode 52 of the transistor is designed perpendicularly to the data lines 51, the first electrode 52 of the transistor may take up a smaller area, more setup space may be reserved for the gate line 20, and thus the problems of large line resistance of the gate line 20 at that position and being unfavorable to signal transmission are avoided.

In some embodiments, referring to FIG. 1A to FIG. 1H, the fifth sub-portion 532 and the sixth sub-portion 533 both extend in the first direction X, and the fourth sub-portion 531 extends in the second direction Y. In the embodiment of the present disclosure, the fifth sub-portion 532 and the sixth sub-portion 533 both extend in the first direction X, so that the second electrode 53 of the transistor can occupy a smaller area, more setup space may be reserved for the gate line 20, and the problems of large line resistance of the gate line 20 at that position and being unfavorable to signal transmission are avoided; and the fourth sub-portion 531 extends in the second direction Y so as to be conductive to the pixel electrodes 32.

In some embodiments, referring to FIG. 2, in embodiments of the present disclosure, the first electrode 52 of the transistor and the second electrode 53 of the transistor may also extend in the second direction Y, so that the value of the coupling capacitance Cgs is substantially reduced by providing the first electrode 31 under the circumstance of a relatively small modification of the array substrate, which is conducive to improving the picture quality and solving the problems such as sticking image or shake head pattern.

Figure 3:
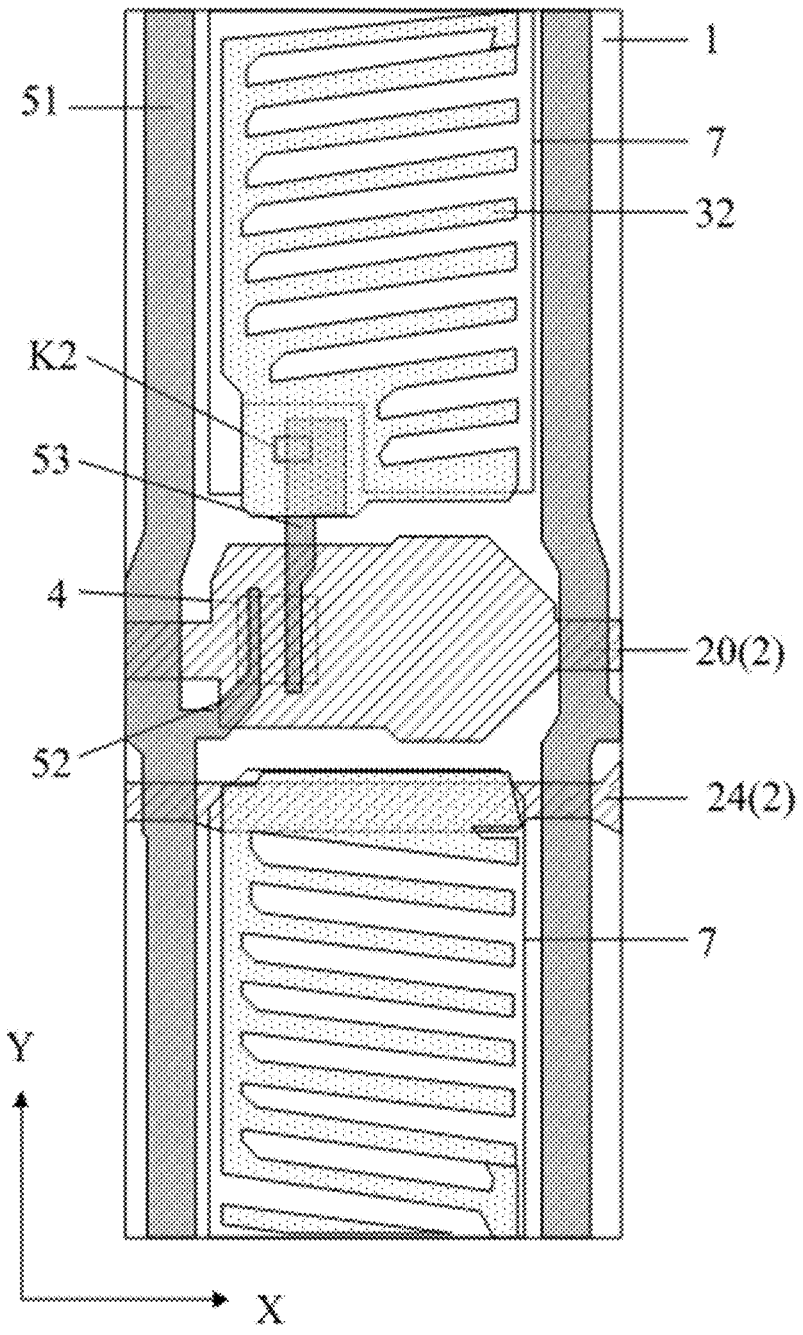
FIG. 3 is a third schematic top-view diagram of an array substrate provided by an embodiment of the present disclosure.

In some embodiments, referring to FIG. 3, in embodiments of the present disclosure, only on the basis of a conventional array substrate, the first electrode 52 of the transistor and the second electrode 53 of the transistor may also be provided as the patterns protruding from the active layer 4 (for example, by reducing the area of the active layer 4) so as to reduce the overlapping area of the active layer 4 and the gate line 20, on the one hand, the load of the gate line 20 can be reduced and the charging rate is improved, and on the other hand, the value of the coupling capacitance Cgs can be effectively reduced, which is conducive to the improvement of the picture quality.

Figure 1B:
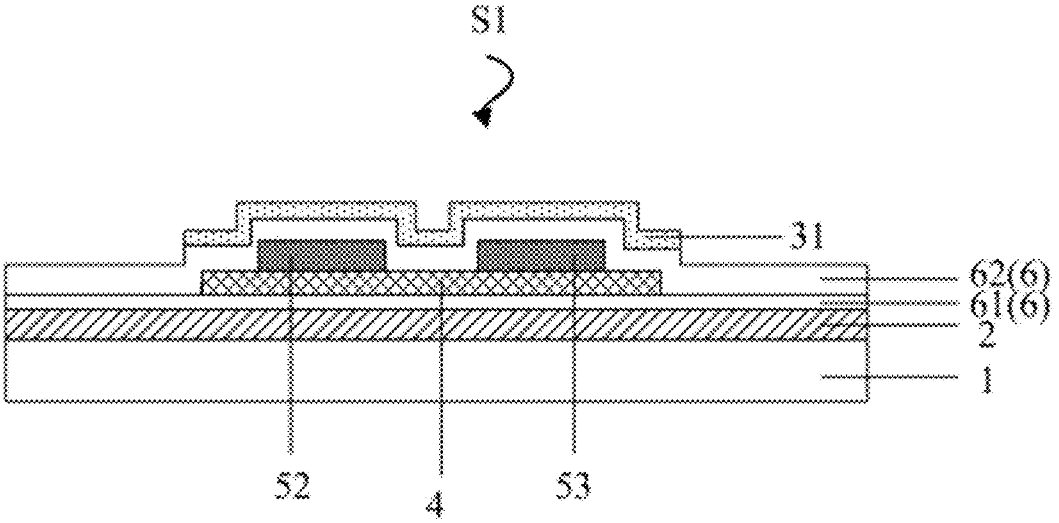
FIG. 1B is a schematic cross-sectional diagram along a dotted line S1 in FIG. 1A.
Figure 1C:
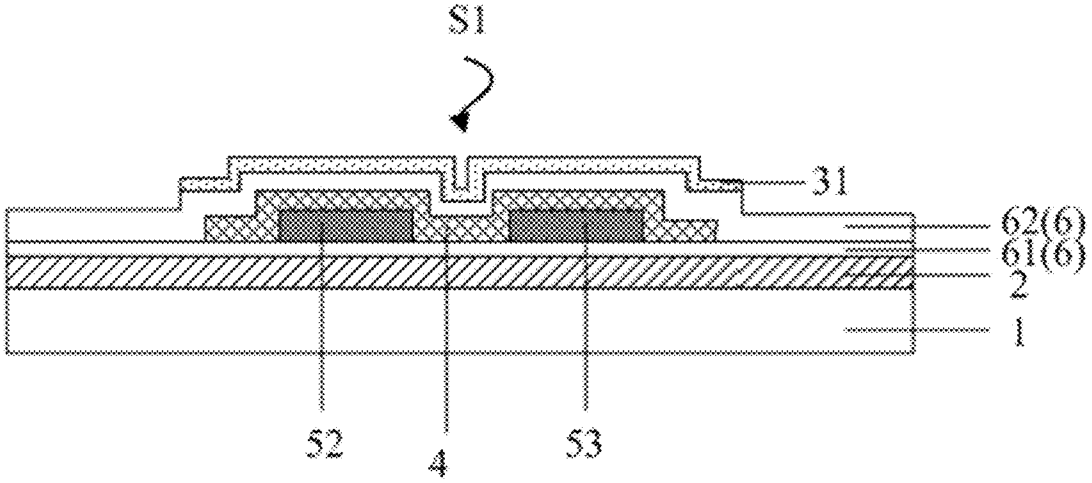
FIG. 1C is another schematic cross-sectional diagram along the dotted line S1 in FIG. 1A.
Figure 1D:
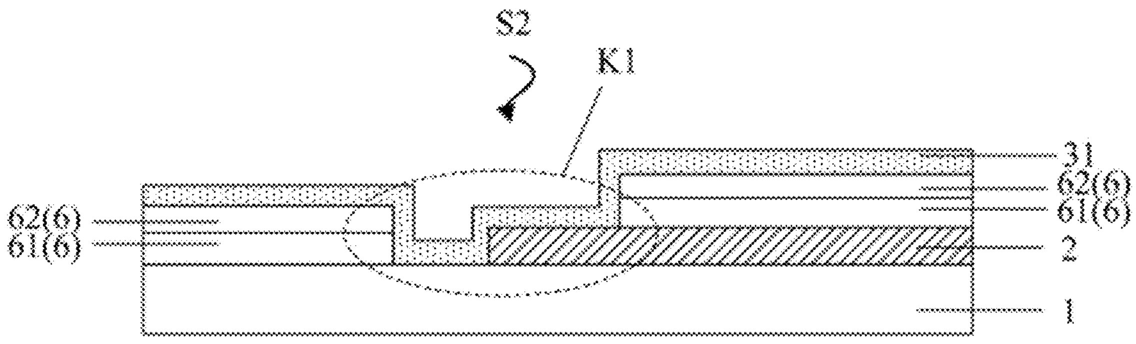
FIG. 1D is a schematic cross-sectional diagram along a dotted line S2 in FIG. 1A.
Figure 1E:
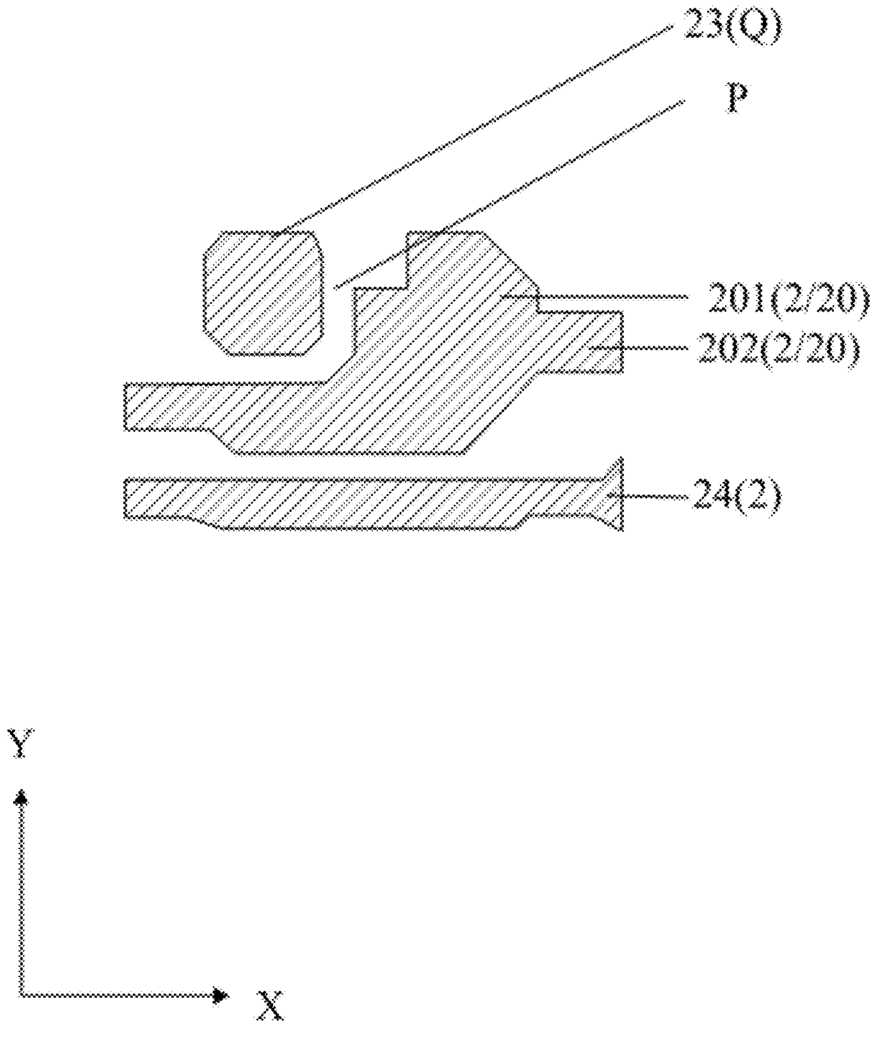
FIG. 1E is a schematic diagram of a single film layer of a gate line layer in FIG. 1A.
Figure 1F:
FIG. 1F is a schematic diagram of a single film layer of an active layer in FIG. 1A.
Figure 1G:
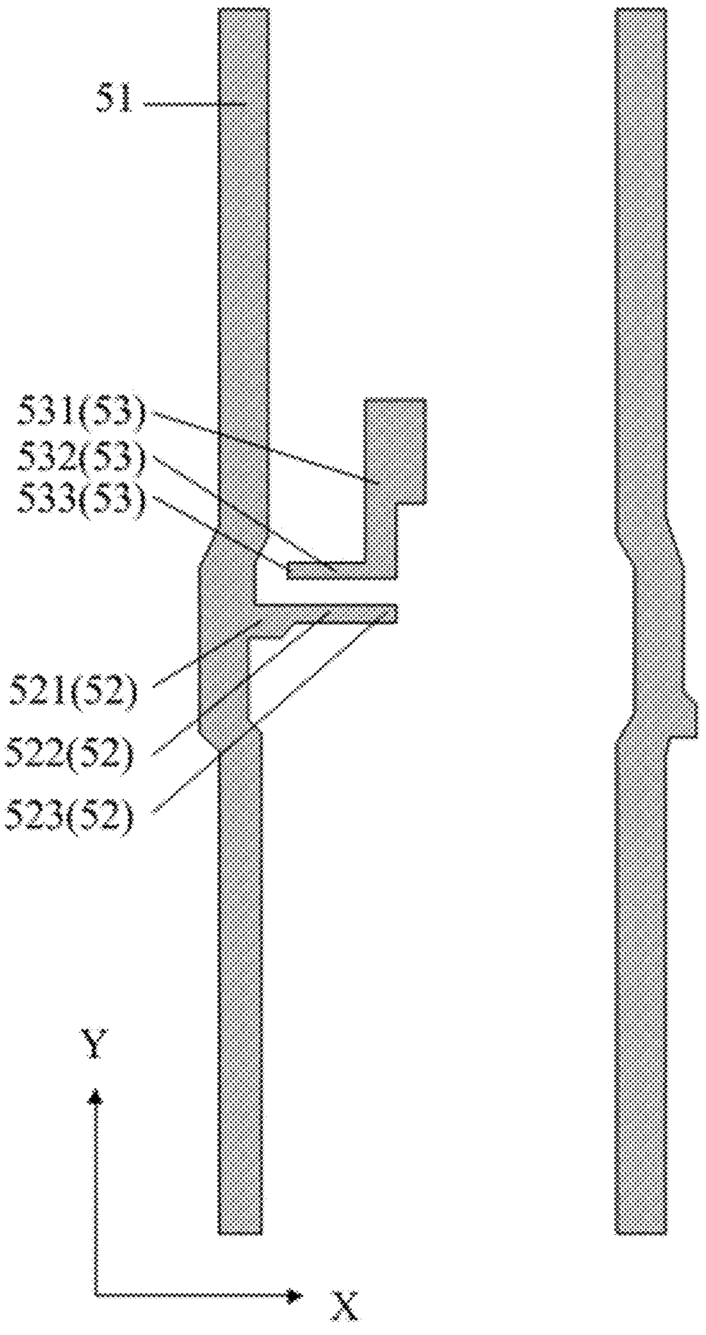
FIG. 1G is a schematic diagram of a single film layer of a data line layer in FIG. 1A.
Figure 1H:
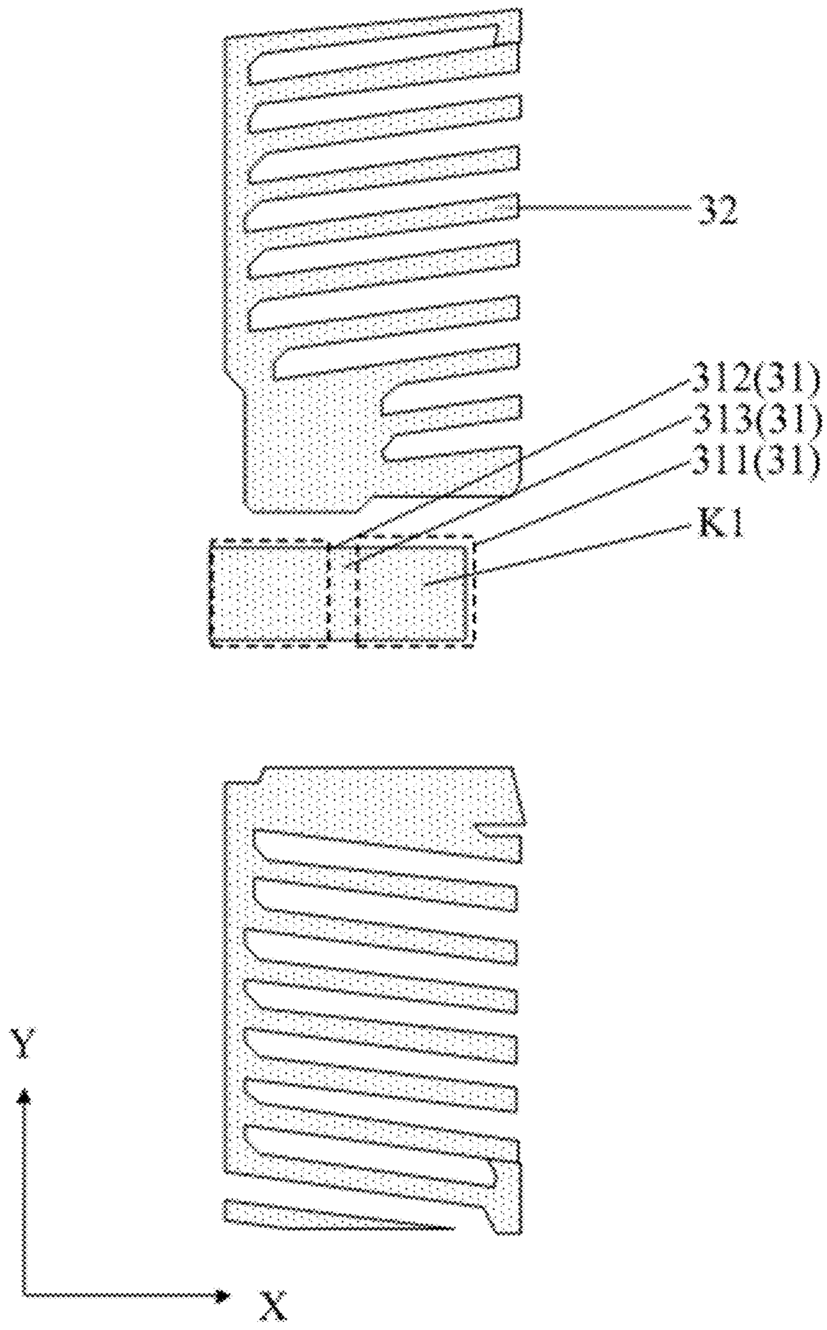
FIG. 1H is a schematic diagram of a single film layer of a pixel electrode layer in FIG. 1A.
Figure 2:
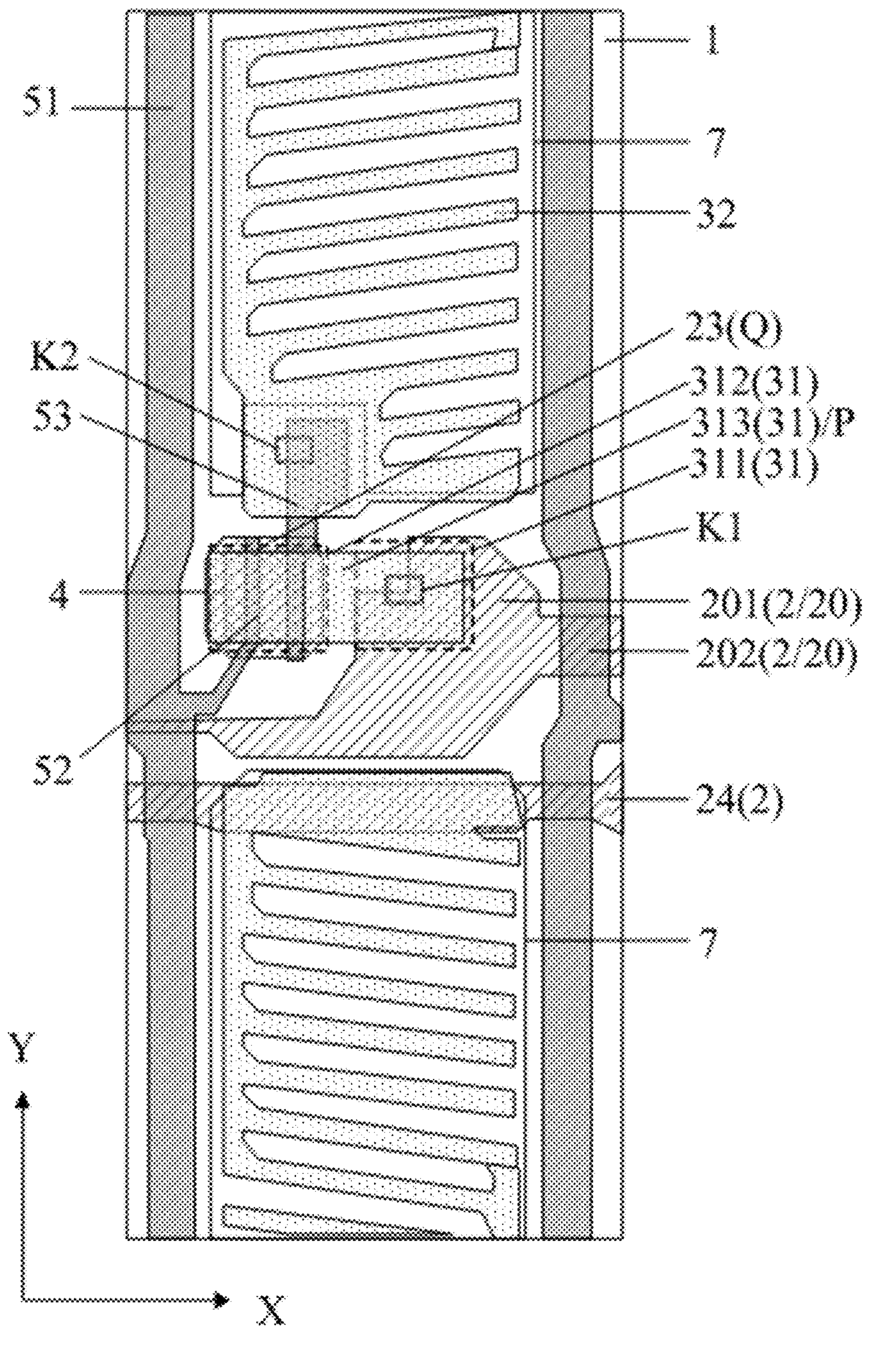
FIG. 2 is a second schematic top-view diagram of an array substrate provided by an embodiment of the present disclosure.

In some embodiments, referring to FIG. 1B, the active layer 4 is arranged between the data line layer and the gate line layer 2.

In some embodiments, referring to FIG. 1C, the active layer 4 is arranged between the data line layer and the first electrode 31.

In some embodiments, referring to FIG. 1D, the first via hole K1 partially exposes the gate line 20, and partially exposes the substrate 1, and an orthographic projection of the first electrode 31 on the substrate 1 covers an orthographic projection of the first via hole K1 on the substrate 1. In the embodiment of the present disclosure, the first via hole K1 partially exposes the gate line 20, and partially exposes the substrate 1, and is of a semi-via-hole design, and a step structure is formed inside the first via hole K1, which provides a drainage effect for alignment fluid, prevents the alignment fluid from not staining, and avoids the phenomenon of moire on pictures.

In some embodiments, the first via hole K1 may also only expose a portion of the gate line 20, and is of a full-via-hole design, so as to improve the process yield.

In some embodiments, referring to FIG. 1B to FIG. 1D, the insulating layer 6 includes: a gate electrode insulating layer 61 and/or a passivation layer 62. In some embodiments, the insulating layer 6 may include: the gate electrode insulating layer 61 and the passivation layer 62, and the passivation layer 62 may be arranged on one side of the gate electrode insulating layer 61 facing away from the substrate 1. The thickness of the passivation layer 62 may be adjusted within a wide range, usually about 0.1 μm to 0.7 μm, and the thickness thereof can be much higher than that of the gate electrode insulating layer 61, so that the top gate design is more conducive to significantly reducing the value of the coupling capacitance Cgs, and thus improving the picture quality.

In some embodiments, referring to FIG. 1A to FIG. 1H, the gate electrode insulating layer 61 has a thickness of 0.35 μm to 0.45 μm. In the embodiment of the present disclosure, the gate electrode insulating layer 61 has a larger thickness, and as shown by the formula $C=\epsilon*S/4\pi kd$, increasing the thickness of the gate electrode insulating layer 61 results in a smaller overlapping capacitance, i.e., a smaller value of Cgs, between the active layer and the gate line 20, which reduces the value of $\Delta Vp$ and improves the picture quality. However, the thickness of the gate electrode insulating layer 61 usually has a large impact on the process yield, and the thickness is usually fixed, so from the process yield, the adjustable thickness of the gate electrode insulating layer 61 is low, usually about 0.35 μm to 0.45 μm.

Figure 4:
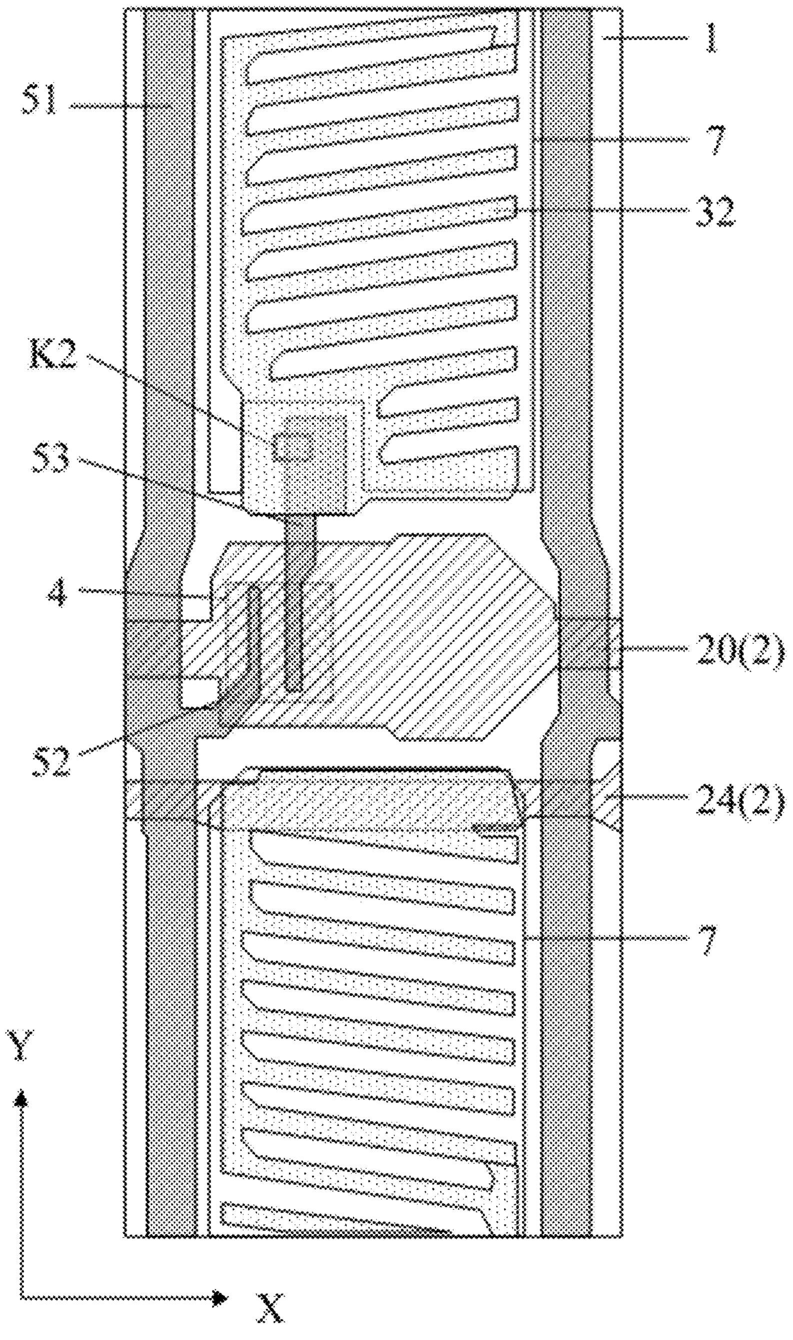
FIG. 4 is a fourth schematic top-view diagram of an array substrate provided by an embodiment of the present disclosure.

In some embodiments, referring to FIG. 4, in embodiments of the present disclosure, the gate electrode insulating layer 61 between the active layer 4 and the gate line layer 2 may also be thickened on the basis of a conventional array substrate only to increase the thickness of the gate electrode insulating layer 61, and the overlapping capacitance, i.e., the value of Cgs, between the active layer and the gate line 20 is reduced, thereby reducing the value of $\Delta Vp$ and improving the picture quality.

In some embodiments, referring to FIG. 1A to FIG. 1H, the gate line layer further includes: a gate electrode 23, and an orthographic projection of the gate electrode 23 on the substrate 1 covers the orthographic projection of the active layer 4 on the substrate 1. In the embodiment of the present disclosure, the gate line layer further includes: the gate electrode 23, which can be formed at the same time as the gate line 20 is formed, and which can be set to be in a floating state, not loaded with a voltage, and not connected with other gate electrode layer metals, with the purpose of shielding the active layer 4 (the active layer 4 may be A-Si, which is unsuitable to be subjected to light) from light, and protecting the characteristics of the active layer 4.

In some embodiments, referring to FIG. 1A to FIG. 1H, the gate electrode 23 and the gate line 20 are mutually insulated and have a gap P. In the embodiment of the present disclosure, the gate electrode 23 and the gate line 20 are mutually insulated and have the gap P, so that it is avoided that when the gate electrode 23 and the gate line 20 are connected together, the gate electrode 23 will be completely at the same voltage with the gate line 20, a large amount of parasitic capacitance will be generated between the gate electrode 23 and a transistor (including the active layer, the first electrode of the transistor, and the second electrode of the transistor) above the gate electrode 23, and pixel loads and the value of the coupling capacitance Cgs will be increased substantially, which is not conductive to the display of the picture quality. Specifically, the gap P has a minimum length of 6 μm or more in the first direction X, so that it is avoided that due to too closer distance, the gate electrode 23 and the gate line 20 are connected together because they cannot be completely etched and disconnected.

In some embodiments, referring to FIG. 1A to FIG. 1H, the gate line 20 includes a first gate line portion 201 and a second gate line portion 202 arrayed in the first direction, wherein an orthographic projection of the first gate line portion 201 on the substrate 1 is arranged between orthographic projections of the adjacent data lines 51 on the substrate 1, and an orthographic projection of the second gate line portion 202 on the substrate 1 overlaps the orthographic projection of one data line 51 on the substrate 1; and the first gate line portion 201 has a missing portion Q, and the gate electrode 23 is arranged in a region where the missing portion Q is located.

In some embodiments, referring to FIG. 1A to FIG. 1H, the first electrode 31 further includes a third electrode sub-portion 313 arranged between the first electrode sub-portion 311 and the second electrode sub-portion 312, an orthographic projection of the third electrode sub-portion 313 on the substrate 1 covers an orthographic projection of the gap P on the substrate 1, and the first electrode sub-portion 311 and the second electrode sub-portion 312 are electrically connected through the third electrode sub-portion 313.

In some embodiments, referring to FIGS. 2 to 4, the array substrate may further include a common electrode 7 arranged between the substrate 1 and the gate line layer 2. In some embodiments, the array substrate may further include a common electrode lead 24 arranged in the gate line layer 2, the common electrode lead 24 laps in direct contact with the common electrode 7, the common electrode lead 24 is arranged in the gate line layer 2, the gate line layer 2 is generally made of a metal and has low resistivity and high conductivity, and the common electrode lead 24 runs through pixel rows, which can enhance the homogeneity of the overall voltage of the common electrode 7 on a display panel.

Based on the same inventive concept, embodiments of the present disclosure further provide a display apparatus, including the array substrate provided by embodiments of the present disclosure. The display apparatus may be: a mobile phone, a tablet computer, a television, a display, a laptop, a digital photo frame, a navigator, a smart watch, a fitness wristband, a personal digital assistant, and any product or component with a display function. Other essential components of the display apparatus shall be understood by those of ordinary skill in the art, and are omitted herein and also shall not become a restriction to the present disclosure. In addition, since the principle for solving problems of the display apparatus is similar to that of the above display panel, implementations of the display apparatus may refer to embodiments of the above liquid crystal display panel, and repeated parts are omitted herein.

It should be noted that in the present disclosure, "same layer" refers to a layer structure formed by using the same film-forming process to form a film layer for producing specific graphics, and then utilizing the same mask by a primary composition process. That is, the primary composition process corresponds to one mask (also called a photomask). Depending on different specific graphics, the primary composition process may include multiple exposure, and development or etching processes, the specific graphics in the formed layer structure may be continuous or discontinuous, and these specific graphics may also be at different heights or have different thicknesses.

In some embodiments, the pixel electrode layer may be of a transparent structure, and the material of the pixel electrode layer includes a metal oxide (e.g., indium tin oxide, indium-doped zinc oxide (AZO), fluorine-doped tin oxide (AZO), aluminum-doped zinc oxide (AZO), and indium-doped cadmium oxide).

Although the preferred embodiments of the present disclosure have been described, those skilled in the art can make additional changes and modifications on these embodiments once they know the basic creative concept. So the appended claims are intended to be interpreted as include the preferred embodiments and all changes and modifications that fall into the scope of the present disclosure.

Apparently, those skilled in the art can perform various changes and modifications on the embodiments of the present disclosure without departing from the spirit and scope of the embodiments of the present disclosure. Therefore, if these changes and modifications on the embodiments of the present disclosure fall in the scope of the claims of the present disclosure and their equivalent technologies, the present disclosure is intended to include these changes and modifications.

What is claimed is:

1. An array substrate, comprising:

a substrate;

a gate line layer, arranged on a side of the substrate, wherein the gate line layer comprises a gate line extending in a first direction;

an insulating layer, arranged on a side of the gate line layer facing away from the substrate, wherein the insulating layer has a first via hole exposing a portion of the gate line;

a first electrode, arranged on a side of the insulating layer facing away from the gate line layer, wherein the first electrode comprises a first electrode sub-portion and a second electrode sub-portion connected with the first electrode sub-portion, an orthographic projection of the first electrode sub-portion on the substrate partially overlaps with an orthographic projection of the gate line on the substrate, and the first electrode sub-portion is electrically connected with the gate line through the first via hole; and an active layer, wherein an orthographic projection of the second electrode sub-portion on the substrate overlaps with an orthographic projection of the active layer on the substrate, and the orthographic projection of the active layer on the substrate does not overlap with the orthographic projection of the gate line on the substrate.

2. The array substrate according to claim 1, wherein the array substrate comprises a pixel electrode layer, the pixel electrode layer comprises a plurality of pixel electrodes, and the first electrode is arranged on the pixel electrode layer and is insulated from the pixel electrodes.

3. The array substrate according to claim 2, wherein the array substrate further comprises a data line layer, and the data line layer is arranged between the gate line layer and the first electrode;

the data line layer comprises: a plurality of data lines extending in a second direction, a first electrode of a transistor connected with one side of one data line, and a second electrode of the transistor provided opposite to the first electrode of the transistor;

the first electrode of the transistor comprises: a first sub-portion, a second sub-portion, and a third sub-portion, wherein one end of the first sub-portion is electrically connected with the data line, the other end of the first sub-portion is electrically connected with one end of the second sub-portion, the other end of the second sub-portion is electrically connected with the third sub-portion, an orthographic projection of the second sub-portion on the substrate overlaps with the orthographic projection of the active layer on the substrate, and an orthographic projection of the third sub-portion on the substrate does not overlap with the orthographic projection of the active layer on the substrate; and the second electrode of the transistor comprises: a fourth sub-portion, a fifth sub-portion, and a sixth sub-portion, wherein an orthographic projection of the fourth sub-portion on the substrate overlaps with an orthographic projection of the pixel electrode on the substrate, an orthographic projection of the fifth sub-portion on the substrate overlaps with the orthographic projection of the active layer on the substrate, and an orthographic projection of the sixth sub-portion on the substrate does not overlap with the orthographic projection of the active layer on the substrate.

4. The array substrate according to claim 3, wherein the first sub-portion, the second sub-portion and the third sub-portion all extend in the first direction.

5. The array substrate according to claim 3, wherein both the fifth sub-portion and the sixth sub-portion extend in the first direction, and the fourth sub-portion extends in the second direction.

6. The array substrate according to claim 3, wherein the active layer is arranged between the data line layer and the gate line layer.

7. The array substrate according to claim 3, wherein the active layer is arranged between the data line layer and the first electrode.

8. The array substrate according to claim 1, wherein the first via hole partially exposes the gate line, and partially exposes the substrate, and an orthographic projection of the first electrode on the substrate covers an orthographic projection of the first via hole on the substrate.

9. The array substrate according to claim 1, wherein the insulating layer comprises: a gate electrode insulating layer and/or a passivation layer.

10. The array substrate according to claim 9, wherein a thickness of the gate electrode insulating layer ranges from 0.35 μm to 0.45 μm.

11. The array substrate according to claim 1, wherein the gate line layer further comprises: a gate electrode, and an orthographic projection of the gate electrode on the substrate covers the orthographic projection of the active layer on the substrate.

12. The array substrate according to claim 11, wherein the gate electrode and the gate line are mutually insulated and have a gap between the gate electrode and the gate line.

13. The array substrate according to claim 12, wherein the gate line comprises a first gate line portion and a second gate line portion arrayed in the first direction, an orthographic projection of the first gate line portion on the substrate is arranged between orthographic projections of adjacent data lines on the substrate, and an orthographic projection of the second gate line portion on the substrate overlaps with an orthographic projection of a data line on the substrate; and the first gate line portion has a missing portion, and the gate electrode is arranged in a region where the missing portion is located.

14. The array substrate according to claim 12, wherein the first electrode further comprises a third electrode sub-portion arranged between the first electrode sub-portion and the second electrode sub-portion, an orthographic projection of the third electrode sub-portion on the substrate covers an orthographic projection of the gap on the substrate, and the first electrode sub-portion and the second electrode sub-portion are electrically connected through the third electrode sub-portion.

15. A display apparatus, comprising the array substrate according to claim 1.

16. The display apparatus according to claim 15, wherein the array substrate comprises a pixel electrode layer, the pixel electrode layer comprises a plurality of pixel electrodes, and the first electrode is arranged on the pixel electrode layer and is insulated from the pixel electrodes.

17. The display apparatus according to claim 16, wherein the array substrate further comprises a data line layer, and the data line layer is arranged between the gate line layer and the first electrode;

the data line layer comprises: a plurality of data lines extending in a second direction, a first electrode of a transistor connected with one side of one data line, and a second electrode of the transistor provided opposite to the first electrode of the transistor;

the first electrode of the transistor comprises: a first sub-portion, a second sub-portion, and a third sub-portion, wherein one end of the first sub-portion is electrically connected with the data line, the other end of the first sub-portion is electrically connected with one end of the second sub-portion, the other end of the second sub-portion is electrically connected with the third sub-portion, an orthographic projection of the second sub-portion on the substrate overlaps with the orthographic projection of the active layer on the substrate, and an orthographic projection of the third sub-portion on the substrate does not overlap with the orthographic projection of the active layer on the substrate; and the second electrode of the transistor comprises: a fourth sub-portion, a fifth sub-portion, and a sixth sub-portion, wherein an orthographic projection of the fourth sub-portion on the substrate overlaps with an orthographic projection of the pixel electrode on the substrate, an orthographic projection of the fifth sub-portion on the substrate overlaps with the orthographic projection of the active layer on the substrate, and an orthographic projection of the sixth sub-portion on the substrate does not overlap with the orthographic projection of the active layer on the substrate.

18. The display apparatus according to claim 17, wherein the first sub-portion, the second sub-portion and the third sub-portion all extend in the first direction.

19. The display apparatus according to claim 17, wherein both the fifth sub-portion and the sixth sub-portion extend in the first direction, and the fourth sub-portion extends in the second direction.

20. The display apparatus according to claim 17, wherein the active layer is arranged between the data line layer and the gate line layer.

* * * * *